(12) United States Patent
Yang et al.

(10) Patent No.: US 11,516,934 B2
(45) Date of Patent: Nov. 29, 2022

(54) WEARABLE DEVICE

(71) Applicant: HUAWEI TECHNOLOGIES CO., LTD., Guangdong (CN)

(72) Inventors: Jun Yang, Shenzhen (CN); Zhihong Tang, Shenzhen (CN); Feng Tian, Xi'an (CN); Jiawei Lv, Xi'an (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/099,384

(22) PCT Filed: May 6, 2016

(86) PCT No.: PCT/CN2016/081288
§ 371 (c)(1),
(2) Date: Nov. 6, 2018

(87) PCT Pub. No.: WO2017/190348
PCT Pub. Date: Nov. 9, 2017

(65) Prior Publication Data
US 2019/0191580 A1 Jun. 20, 2019

(51) Int. Cl.
*H05K 5/00* (2006.01)
*H05K 5/03* (2006.01)
(Continued)

(52) U.S. Cl.
CPC .............. *H05K 5/03* (2013.01); *G04G 17/08* (2013.01); *G06F 1/163* (2013.01); *G06F 1/1656* (2013.01);
(Continued)

(58) Field of Classification Search
CPC ...... H05K 5/03; H05K 5/0213; H05K 5/0086; G04G 17/08; G06F 1/1656; G06F 1/163; H04M 1/02
See application file for complete search history.

(56) References Cited

U.S. PATENT DOCUMENTS 8,055,007 B2 * 11/2011 Kim .................... H04R 1/1041
381/372
8,139,373 B2 * 3/2012 Suzuki .................. H02S 40/34
361/810
(Continued)

FOREIGN PATENT DOCUMENTS

CN 201741140 U 2/2011
CN 102724338 A 10/2012
(Continued)

OTHER PUBLICATIONS

International Search Report and Written Opinion issued in International Application No. PCT/CN2016/081288 dated Feb. 4, 2017, 30 pages.
(Continued)

*Primary Examiner* — Rockshana D Chowdhury
(74) *Attorney, Agent, or Firm* — Fish & Richardson P.C.

(57) ABSTRACT

A wearable device is provided, including a shell, a body installed in the shell to implement a function of the wearable device, and a detachable part. The detachable part is detachably installed on the shell. An air hole is provided on the shell, a first end of the air hole is located on a surface of the shell that faces the body, and a second end of the air hole is located on a surface of the shell that faces away from the body. The detachable part and the shell jointly form a dirt collection groove and at least one air channel, the air hole communicates with the at least one air channel through the dirt collection groove, and an end of the air channel that faces away from the dirt collection groove communicates with an external environment of the shell.

14 Claims, 3 Drawing Sheets

(51) Int. Cl.
*H04M 1/02* (2006.01)
*G06F 1/16* (2006.01)
*G04G 17/08* (2006.01)
*H05K 5/02* (2006.01)

(52) U.S. Cl.
CPC ............ *H04M 1/02* (2013.01); *H05K 5/0086* (2013.01); *H05K 5/0213* (2013.01)

(56) References Cited

U.S. PATENT DOCUMENTS

| | | | | |
|---|---|---|---|---|
| 8,467,561 | B2* | 6/2013 | Tung | H04R 1/1041 381/373 |
| 9,578,412 | B2* | 2/2017 | Azmi | H04R 1/2826 |
| 9,661,410 | B1* | 5/2017 | Iwai | H05K 5/0217 |
| 2009/0041281 | A1* | 2/2009 | Chang | H04R 1/2811 381/345 |
| 2012/0106201 | A1* | 5/2012 | Choi | H04M 1/0202 361/679.01 |
| 2012/0188857 | A1* | 7/2012 | Sabatini | G04B 37/00 368/282 |
| 2013/0136290 | A1* | 5/2013 | Huang | H04R 1/1016 381/345 |
| 2013/0242522 | A1* | 9/2013 | Yoo | H05K 5/0017 361/807 |
| 2014/0079269 | A1* | 3/2014 | Choi | H04R 1/342 381/365 |
| 2014/0140565 | A1* | 5/2014 | Liu | H04R 1/26 381/380 |
| 2014/0301591 | A1* | 10/2014 | Yang | H04R 1/1016 381/380 |
| 2015/0219608 | A1 | 8/2015 | Choi et al. | |
| 2015/0289051 | A1* | 10/2015 | Tung | H04R 1/023 381/334 |
| 2015/0303503 | A1* | 10/2015 | Winand | G06F 1/203 361/679.02 |
| 2015/0334859 | A1 | 11/2015 | Lee et al. | |
| 2016/0259481 | A1 | 9/2016 | Lee et al. | |
| 2016/0299536 | A1 | 10/2016 | Mori et al. | |
| 2019/0191580 | A1* | 6/2019 | Yang | G06F 1/163 |

FOREIGN PATENT DOCUMENTS

| | | |
|---|---|---|
| CN | 202602872 U | 12/2012 |
| CN | 202980368 U | 6/2013 |
| CN | 104219910 A | 12/2014 |
| CN | 204350509 U | 5/2015 |
| CN | 204425433 U | 6/2015 |
| CN | 104980572 A | 10/2015 |
| JP | 2017117895 A | 6/2017 |
| WO | 2015097937 A1 | 7/2015 |

OTHER PUBLICATIONS

CN Office Action in Chinese Application No. 201680023870.8, dated Apr. 2, 2019, 15 pages (with English translation).
Office Action issued in Japanese Application No. 2018-558197 dated Oct. 15, 2019, 7 pages (with English translation).

* cited by examiner

WEARABLE DEVICE

CROSS-REFERENCE TO RELATED APPLICATIONS

This application is a national stage of International Application No. PCT/CN2016/081288, filed on May 6, 2016, which is hereby incorporated by reference in its entirety.

TECHNICAL FIELD

The present invention relates to the field of electronic technologies, and in particular, to a wearable device.

BACKGROUND

With rapid development of electronic device technologies, products of wearable apparatuses are continuously increasing and technologies of the wearable apparatuses are becoming mature. Wearable devices, such as watches and wristbands, attract growing attention and become increasingly popular.

Existing wearable devices on the market are usually claimed to have a water-proof function. For a wearable device, to improve water-proof performance, air tightness of the wearable device needs to be good enough. However, if the air tightness of the wearable device is good, breathability between an interior and an exterior of a shell of the wearable device becomes quite poor. Moreover, when the wearable device is being used, a temperature inside the shell gradually rises, leading to an increasing air pressure inside the shell. If air inside the shell cannot be effectively discharged, an interior-exterior air pressure difference is generated between the interior and the exterior of the shell, and the interior-exterior air pressure difference of the shell affects some components (for example, a loudspeaker) in the shell of the wearable device.

To prevent generation of an interior-exterior air pressure difference during use of a wearable device, a currently used method is: On a shell of the wearable device, a balance air hole that implements communication between an interior and an exterior of the shell is opened to balance air pressures inside and outside the shell. In addition, to achieve water resistance at the same time, a water-proof and breathable film needs to be attached to a first end of the balance air hole, to prevent water from entering the interior of the shell through the balance air hole.

However, when in use, the wearable device is in frequent contact with a human body or an external environment, and a second end of the balance air hole is often blocked by dirt in the external environment, disabling the balance air hole from balancing the air pressures inside and outside the shell. Moreover, once the second end of the balance air hole on the shell of the existing wearable device is blocked, a user finds it quite difficult to remove the dirt that blocks the balance air hole, leading to poor user experience.

SUMMARY

The present invention provides a wearable device. During use of the wearable device, a user can conveniently remove dirt that blocks a balance air hole, thereby improving user experience in using the product.

According to a first aspect, a wearable device is provided, including a shell, a body installed in the shell to implement a function of the wearable device, and a detachable part, where the detachable part is detachably installed on the shell; an air hole is provided on the shell, a first end of the air hole is located on a surface of the shell that faces the body, and a second end of the air hole is located on a surface of the shell that faces away from the body; and the detachable part and the shell jointly form a dirt collection groove and at least one air channel, the air hole communicates with the at least one air channel through the dirt collection groove, and an end of the air channel that faces away from the dirt collection groove communicates with an external environment of the shell.

In the wearable device, when entering a balance air hole, sundries such as dirt in the external environment first enter the air channel, and then are brought together to the dirt collection groove. When needing to clean the balance air hole of the wearable device, a user detaches the detachable part from the shell, so that the dirt collection groove is exposed, and the user can remove the sundries stored in the dirt collection groove. Therefore, in the wearable device, the user can conveniently remove the dirt that blocks the balance air hole, thereby improving user experience in using the product.

With reference to the first aspect, in a first possible implementation, a first concave part is provided on a surface of the detachable part that faces the second end of the air hole, and the first concave part and the surface of the shell that faces away from the body jointly form the dirt collection groove. In this case, when the detachable part is detached from the shell, the sundries stored in the dirt collection groove can also be taken from the shell, further enhancing convenience in dirt handling.

With reference to the first aspect, in a second possible implementation, the first concave part and the surface of the shell that faces away from the body also jointly form a connection channel configured to implement communication between the dirt collection groove and the second end of the air hole.

With reference to the first aspect, in a third possible implementation, a second concave part is formed on the surface of the shell that faces away from the body, and the second concave part and a surface of the detachable part jointly form the dirt collection groove. In this case, even if the detachable part can move relative to the shell after it is installed on the shell, a relative position between the dirt collection groove and an opening at the second end of the air hole does not change. This can further improve stability of communication between the dirt collection groove and the opening at the second end of the air hole.

With reference to the third possible implementation of the first aspect, in a fourth possible implementation, the second concave part and the surface of the shell that faces away from the body also jointly form a connection channel configured to implement communication between the dirt collection groove and the second end of the air hole.

With reference to the first aspect, in a fifth possible implementation, a third concave part is provided on a surface of the detachable part that faces an opening at the second end of the air hole, a fourth concave part opposite to an opening of the third concave part is provided on the surface of the shell that faces away from the body, and the third concave part and the fourth concave part jointly form the dirt collection groove.

With reference to any one of the first aspect, the first possible implementation, the second possible implementation, the third possible implementation, the fourth possible implementation, or the fifth possible implementation, in a sixth possible implementation, a fifth concave part is formed on the surface of the detachable part, and the fifth concave part and an outer surface of the body jointly form the air channel.

With reference to any one of the first aspect, the first possible implementation, the second possible implementation, the third possible implementation, the fourth possible implementation, or the fifth possible implementation, in a seventh possible implementation, a via is provided inside the detachable part to form the air channel.

With reference to any one of the first aspect, or the first possible implementation, the second possible implementation, the third possible implementation, the fourth possible implementation, the fifth possible implementation, the sixth possible implementation, and the seventh possible implementation of the first aspect, in an eighth possible implementation, there are at least two air channels. In this case, when one of the air channels is blocked, the dirt collection groove can still communicate with the external environment of the shell through another air channel. A probability that multiple air channels are blocked at the same time is quite low. Therefore, a probability that the balance air hole is blocked can be lowered, and function stability of the balance air hole in the wearable device can be improved.

With reference to any one of the first aspect, or the first possible implementation, the second possible implementation, the third possible implementation, the fourth possible implementation, the fifth possible implementation, the sixth possible implementation, and the seventh possible implementation of the first aspect, in a ninth possible implementation, a groove is formed on the outer surface of the body, the second end of the air hole is located at the bottom of the groove, and at least a portion of the detachable part is embedded in the groove.

With reference to any one of the first aspect, or the first possible implementation, the second possible implementation, the third possible implementation, the fourth possible implementation, the fifth possible implementation, the sixth possible implementation, and the seventh possible implementation of the first aspect, in a tenth possible implementation, the wearable device is a watch, and the detachable part is a watch band.

With reference to any one of the first aspect, or the first possible implementation, the second possible implementation, the third possible implementation, the fourth possible implementation, the fifth possible implementation, the sixth possible implementation, and the seventh possible implementation of the first aspect, in an eleventh possible implementation, a slot configured for insertion of an identity module SIM card is provided on the shell, and the detachable part is a card cover configured to cap the slot.

With reference to any one of the first aspect, or the first possible implementation, the second possible implementation, the third possible implementation, the fourth possible implementation, the fifth possible implementation, the sixth possible implementation, the seventh possible implementation, the eighth possible implementation, the ninth possible implementation, the tenth possible implementation, and the eleventh possible implementation of the first aspect, in a twelfth possible implementation, the wearable device further includes a water-proof and breathable film configured to seal the air hole; and the water-proof and breathable film is disposed on the surface of the shell that faces the body, to seal the first end of the air hole, or the water-proof and breathable film is disposed on the surface of the shell that faces away from the body, to seal the second end of the air hole. After the water-proof and breathable film is disposed, moisture can be prevented from entering an interior of the shell without affecting breathability of the air hole, and the sundries in the air hole can further be blocked.

In the wearable device according to the first aspect, the dirt collection groove communicates with the second end of the air hole provided on the shell, and the air channel communicates with the dirt collection groove and the external environment. Therefore, the balance air hole formed by the air channel, the dirt collection groove, and the air hole can implement communication between internal space of the shell and the external environment, thereby implementing a function of balancing air pressures inside and outside the shell. In addition, when entering the balance air hole, the sundries such as dirt in the external environment first enter the air channel, and then are brought together to the dirt collection groove. When needing to clean the balance air hole of the wearable device, the user detaches the detachable part from the shell, so that the dirt collection groove is exposed, and the user can remove the sundries stored in the dirt collection groove. Therefore, in the wearable device, the user can conveniently remove the dirt that blocks the balance air hole, thereby improving user experience in using the product.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

An embodiment of the present invention provides a wearable device. A user can conveniently remove dirt that blocks a balance air hole of the wearable device, so as to balance air pressures inside and outside the wearable device. This effectively extends a lifespan of an internal element of the device, and improves user experience in using the product.

Figure 1:
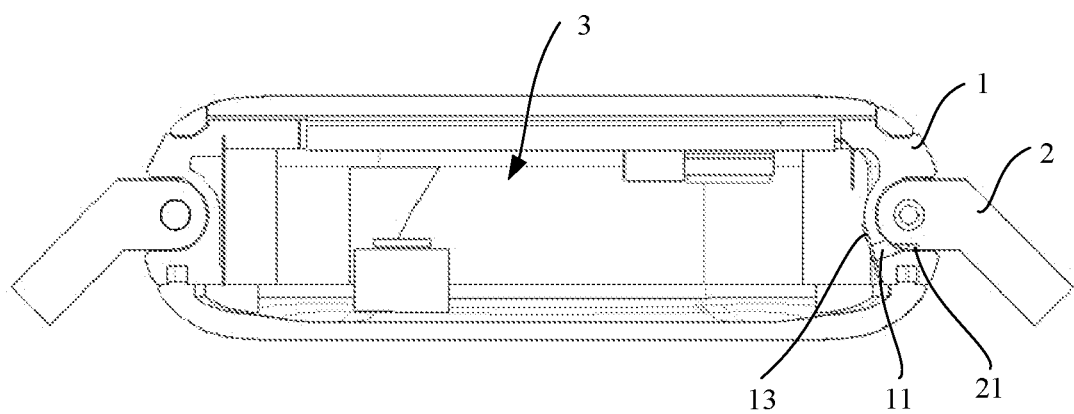
FIG. 1 is a schematic structural diagram of a wearable device according to an embodiment of the present invention.
Figure 2:
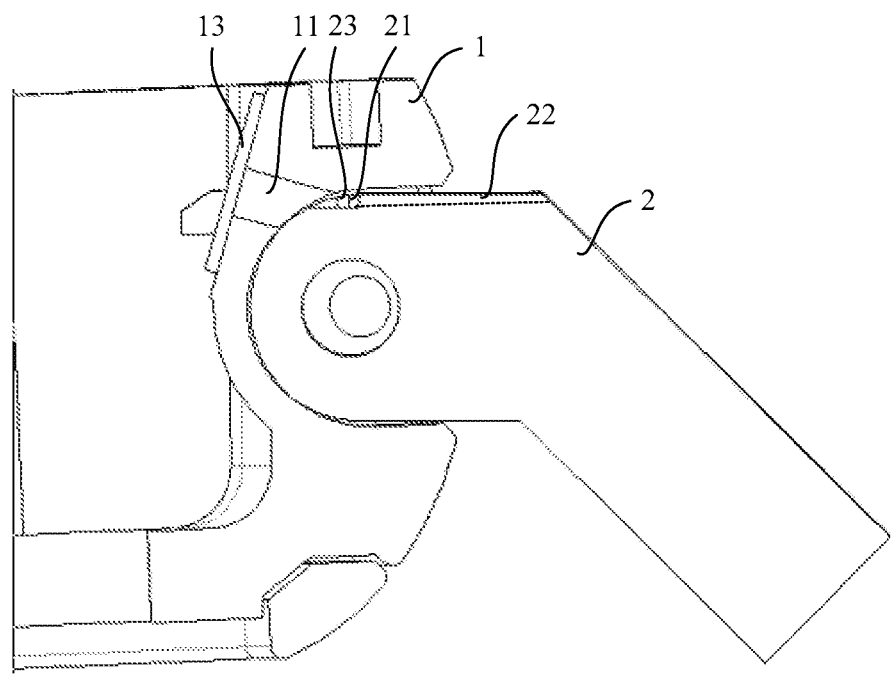
FIG. 2 is a schematic diagram of a collaboration structure between a detachable part and a shell of a wearable device according to an embodiment of the present invention.

As shown in FIG. 1 and FIG. 2, the wearable device includes a shell 1 and a body 3 installed in the shell 1 to implement a function of the wearable device. The wearable device further includes a detachable part 2, and the detachable part 2 is detachably installed on the shell 1. An air hole 11 is provided on the shell 1, a first end of the air hole 11 is located on a surface of the shell 1 that faces the body 3, and a second end of the air hole 11 is located on a surface of the shell 1 that faces away from the body 3. When installed on the shell 1, the detachable part 2 covers the second end of the air hole 11, and the detachable part 2 and the shell 1 jointly form a dirt collection groove 21 and at least one air channel 22. The air hole 11 communicates with the air channel 22 through the dirt collection groove 21, and an end of the air channel 22 that faces away from the dirt collection groove 21 communicates with an external environment of the shell 1, that is, the air hole 11, the dirt collection groove 21, and the air channel 22 jointly form the balance air hole.

In the wearable device, the dirt collection groove 21 communicates with the second end of the air hole 11 provided on the shell 1, and the air channel 22 communicates with the dirt collection groove 21 and the external environment of the shell 1. Therefore, the balance air hole formed by the air channel 22, the dirt collection groove 21, and the air hole 11 can implement communication between internal space of the shell 1 and the external environment, thereby implementing a function of balancing air pressures inside and outside the shell 1. In addition, when entering the balance air hole, sundries such as dirt in the external environment first enter the air channel 22, and then are brought together to the dirt collection groove 21. When needing to clean the balance air hole of the wearable device, the user detaches the detachable part 2 from the shell 1, so that the dirt collection groove 21 is exposed, and the user can remove the sundries stored in the dirt collection groove 21.

Therefore, in the wearable device, the user can conveniently remove the dirt that blocks the balance air hole, thereby improving user experience in using the product.

Figure 3:
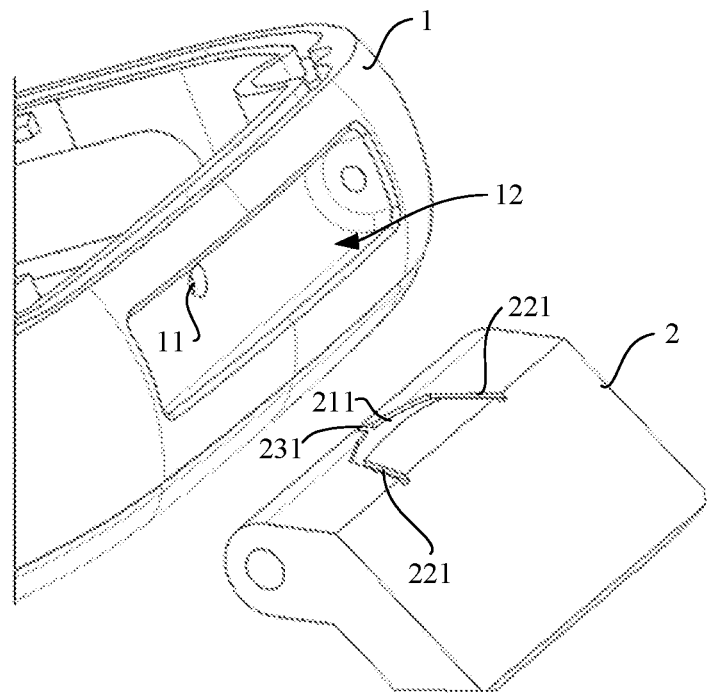
FIG. 3 is an exploded diagram of a collaboration structure between a detachable part and a shell of a wearable device according to an embodiment of the present invention.
Figure 4:
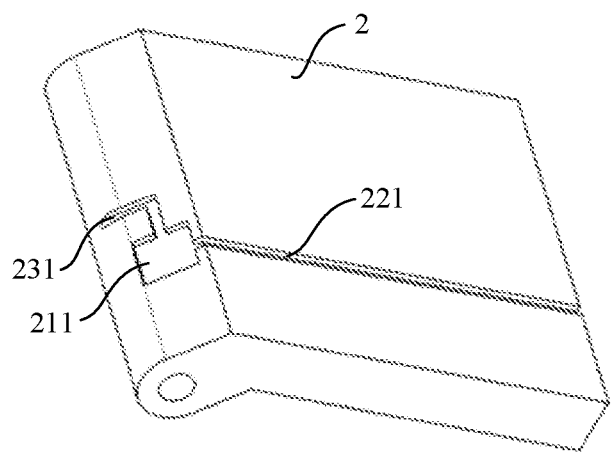
FIG. 4 is a schematic structural diagram of a detachable part in a wearable device according to an embodiment of the present invention.

The detachable part 2 and the body 1 may jointly form the dirt collection groove 21 and the air channel 22 in multiple manners. Details are described as follows:

Manner 1: Specifically as shown in FIG. 3 and FIG. 4, a first concave part is provided on a surface of the detachable part 2 that faces the second end of the air hole 11, and the first concave part and the surface of the shell 1 that faces away from the body 1 jointly form the dirt collection groove 21. For example, a concave section 211 in the first concave part is configured to form the dirt collection groove 21 jointly with the surface of the shell 1 that faces away from the body 3. In this case, the sundries such as dirt are stored in the concave section 211 of the first concave part, and when the detachable part is detached from the shell, the sundries stored in the concave section 211 of the first concave part can also be taken from the shell, further enhancing convenience in dirt handling.

Certainly, the first concave part may further include a concave section 231 configured to form a connection channel 23 that implements communication between the dirt collection groove 21 and the air hole 11.

Figure 5:
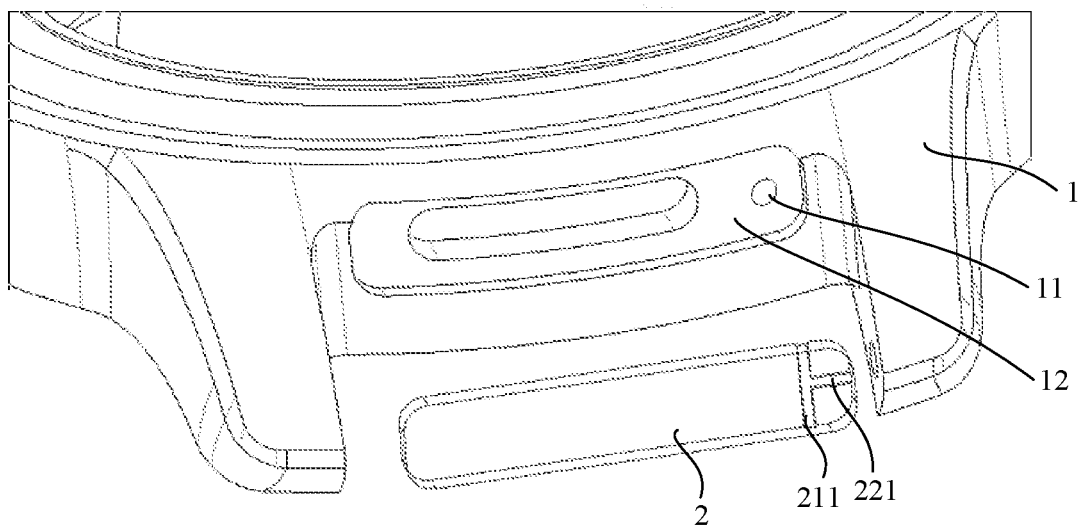
FIG. 5 is an exploded diagram of a collaboration structure between a detachable part and a shell of a wearable device according to another embodiment of the present invention.

Certainly, the concave section 211 that is in the first concave part and that is configured to form the dirt collection groove 21 may alternatively be opposite to the air hole 11, that is, the second end of the air hole 11 is directly located on a wall of the formed dirt collection groove 21, specifically as shown in FIG. 5.

Manner 2: Certainly, a second concave part (not shown in the figure) may alternatively be formed on the surface of the shell 1 that faces away from the body 3, and the second concave part and a surface of the detachable part 2 jointly form the dirt collection groove 21. In this case, even if the detachable part 2 can move relative to the shell 1 after it is installed on the shell 1, a relative position between the dirt collection groove 21 and an opening at the second end of the air hole 11 does not change. This can further improve stability of communication between the dirt collection groove 21 and the opening at the second end of the air hole 11.

Based on Manner 2, the second concave part formed on the surface of the shell 1 that faces away from the body 3 may further include a concave section (not shown in the figure) configured to form a connection channel 23 that implements communication between the dirt collection groove 21 and the second end of the air hole 11.

Manner 3: A third concave part is provided on the surface of the detachable part 2 that faces an opening at the second end of the air hole 11, a fourth concave part opposite to an opening of the third concave part is provided on the surface of the shell 1 that faces away from the body 3, and the third concave part and the fourth concave part jointly form the dirt collection groove 21.

Certainly, the dirt collection groove 21 may also be formed in other manners. For example, a concave part that forms the dirt collection groove 21 is formed on the detachable part 2, while a concave part that forms the connection channel 23 implementing communication between the air hole 11 and the dirt collection groove 21 may be formed on the surface of the shell 1 that faces away from the body 3. Certainly, a reverse manner is also supported, that is, the concave part that forms the dirt collection groove 21 is formed on the surface of the shell 1 that faces away from the body 3, while the concave part that forms the connection channel 23 implementing communication between the air hole 11 and the dirt collection groove 21 may be formed on an outer surface of the detachable part 2. The manners are not listed herein one by one.

Certainly, the air channel 22 may also be formed in multiple manners. Details are described as follows.

Manner 1: As shown in FIG. 3, FIG. 4, and FIG. 5, a third concave part 221 may be formed on the surface of the detachable part 2, and the third concave part 221 and the surface of the shell 1 that faces away from the body 3 jointly form the air channel 22.

Manner 2: A via may alternatively be provided inside the detachable part 2 to form the air channel 22.

Manner 3: Certainly, a concave part may alternatively be provided on the surface of the shell 1 that faces away from the body 3, to form the air channel 22 jointly with the surface of the detachable part 2.

The air channel 22 may be formed in other manners. The manners are not listed herein one by one.

Certainly, there may be at least two air channels 22 that are configured to form the balance air hole. Specifically as shown in FIG. 3, the concave section 221 that is provided on the detachable part 2 and that is configured to form the air channel 22 may form at least two air channels 22 jointly with the surface of the shell 1 that faces away from the body 3. In this case, when one of the air channels 22 is blocked, the dirt collection groove 21 can still communicate with the external environment of the shell through another air channel 22. A probability that multiple air channels 22 are blocked at the same time is quite low. Therefore, a probability that the balance air hole is blocked can be lowered, and function stability of the balance air hole in the wearable device can be improved.

Specifically, as shown in FIG. 3 and FIG. 5, a groove 12 is formed on the surface of the shell 1 that faces away from the body 3, the second end of the air hole 11 is located at the bottom of the groove 12, and at least a portion of the detachable part 2 is embedded in the groove 12. The detachable part 2 is embedded in the groove 12 formed on the surface of the shell 1 that faces away from the body 3. This can help achieve stability of collaboration between the outer surface of the detachable part 2 and the surface of the shell 1 that faces away from the body 3, and also facilitate assembly and disassembly of the detachable part 2 and the shell 1.

Specifically, the wearable device may be a watch, and the detachable part 2 that is detachably connected to the shell 1 may specifically be a watch band.

Certainly, a slot configured for insertion of an identity module SIM card may be provided on the shell 1 of the wearable device. That is, the card slot configured for insertion of the identity module SIM card forms the groove 12, and the detachable part 2 is a card cover configured to cap the slot, as shown in FIG. 5.

To improve water-proof performance of the balance air hole, the wearable device further includes a water-proof and breathable film 13 for sealing the air hole 11. The water-proof and breathable film 13 may be disposed on the surface of the shell 1 that faces the body 3, to seal the first end of the air hole 11, specifically as shown in FIG. 1 and FIG. 2. Certainly, the water-proof and breathable film 13 may alternatively be disposed on the surface of the shell 1 that faces away from the body 3, to seal the second end of the air hole 11 (not shown in the figure). After the water-proof and breathable film 13 is disposed, moisture can be prevented from entering an interior of the shell 1 without affecting breathability of the air hole 11, and the sundries in the air hole 11 can further be blocked.

A person skilled in the art can make various modifications and variations to embodiments of the present invention without departing from the spirit and scope of the present invention. The present invention is intended to cover these modifications and variations provided that they fall within the scope of protection defined by the following claims and their equivalent technologies.

What is claimed is:

1. A wearable device, comprising
    a shell comprising an air hole;
    a body installed in the shell to implement a function of the wearable device; and
    a detachable part, wherein the detachable part is detachably installed on a surface of the shell that faces away from the body, wherein:
        a first end of the air hole is located on a surface of the shell that faces the body, and a second end of the air hole is located on the surface of the shell that faces away from the body; and
        the detachable part and the shell jointly form a dirt collection groove and at least one air channel, wherein the air hole communicates with the at least one air channel through the dirt collection groove, and an end of the air channel that faces away from the dirt collection groove communicates with an external environment of the shell.

2. The wearable device according to claim 1, wherein a first concave part is provided on a surface of the detachable part that faces the second end of the air hole, and the first concave part and the surface of the shell that faces away from the body jointly form the dirt collection groove.

3. The wearable device according to claim 1, wherein a second concave part is formed on the surface of the shell that faces away from the body, and the second concave part and a surface of the detachable part jointly form the dirt collection groove.

4. The wearable device according to claim 1, wherein a third concave part is provided on a surface of the detachable part that faces the second end of the air hole, a fourth concave part opposite to an opening of the third concave part is provided on the surface of the shell that faces away from the body, and the third concave part and the fourth concave part jointly form the dirt collection groove.

5. The wearable device according to claim 1, wherein a via is provided inside the detachable part to form the air channel.

6. The wearable device according to claim 1, comprising at least two air channels.

7. The wearable device according to claim 1, wherein the wearable device further comprises a water-proof and breathable film for sealing the air hole; and wherein:
    the water-proof and breathable film is disposed on the surface of the shell that faces the body, and the water-proof and breathable film seals the first end of the air hole, or
    the water-proof and breathable film is disposed on the surface of the shell that faces away from the body, and the water-proof and breathable film seals the second end of the air hole.

8. A wearable device comprising a watch or a wristband, comprising
    a shell comprising an air hole;
    a body of the watch or the wristband installed in the shell to implement a function of the watch or the wristband; and
    a detachable part of the watch or the wristband, wherein the detachable part is detachably installed on the shell, wherein:
        a first end of the air hole is located on a surface of the shell that faces the body, and a second end of the air hole is located on a surface of the shell that faces away from the body; and
        the detachable part and the shell jointly form a dirt collection groove and at least one air channel, wherein the air hole communicates with the at least one air channel through the dirt collection groove, and an end of the air channel that faces away from the dirt collection groove communicates with an external environment of the shell.

9. The wearable device according to claim 8, wherein a first concave part is provided on a surface of the detachable part that faces the second end of the air hole, and the first concave part and the surface of the shell that faces away from the body jointly form the dirt collection groove.

10. The wearable device according to claim 8, wherein a second concave part is formed on the surface of the shell that faces away from the body, and the second concave part and a surface of the detachable part jointly form the dirt collection groove.

11. The wearable device according to claim 8, wherein a third concave part is provided on a surface of the detachable part that faces the second end of the air hole, a fourth concave part opposite to an opening of the third concave part is provided on the surface of the shell that faces away from the body, and the third concave part and the fourth concave part jointly form the dirt collection groove.

12. The wearable device according to claim 8, wherein a via is provided inside the detachable part to form the air channel.

13. The wearable device according to claim 8, comprising at least two air channels.

14. The wearable device according to claim 8, wherein the wearable device further comprises a water-proof and breathable film for sealing the air hole; and wherein:
- the water-proof and breathable film is disposed on the surface of the shell that faces the body, and the water-proof and breathable film seals the first end of the air hole, or
- the water-proof and breathable film is disposed on the surface of the shell that faces away from the body, and the water-proof and breathable film seals the second end of the air hole.

\* \* \* \* \*